(12) United States Patent
Kimura et al.

(10) Patent No.: US 8,575,835 B2
(45) Date of Patent: Nov. 5, 2013

(54) ORGANIC LUMINESCENT DEVICE AND METHOD FOR MANUFACTURING THE SAME

(75) Inventors: Toshihide Kimura, Kawasaki (JP);
Tomoyuki Hiroki, Mobara (JP);
Manabu Otsuka, Narashino (JP);
Nobuhiko Sato, Mobara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/594,560

(22) Filed: Aug. 24, 2012

(65) Prior Publication Data

US 2013/0057142 A1    Mar. 7, 2013

(30) Foreign Application Priority Data

Sep. 2, 2011  (JP) ................................ 2011-191413
Aug. 8, 2012  (JP) ................................ 2012-176006

(51) Int. Cl.
*H01J 1/62* (2006.01)

(52) U.S. Cl.
USPC .......................................... 313/504; 313/506

(58) Field of Classification Search
USPC ................... 313/498, 504, 506, 512
See application file for complete search history.

(56) References Cited

FOREIGN PATENT DOCUMENTS

JP    4578026 B2    11/2010

*Primary Examiner* — Vip Patel
(74) *Attorney, Agent, or Firm* — Canon U.S.A., Inc. IP Division

(57) ABSTRACT

Among end portions of a plurality of organic compound layers patterned by photolithography, an end portion in an area that is not located between luminescent elements and that is located in an area covered with a second electrode is formed to have a smaller inclination angle than that of an end portion located between the luminescent elements.

13 Claims, 11 Drawing Sheets

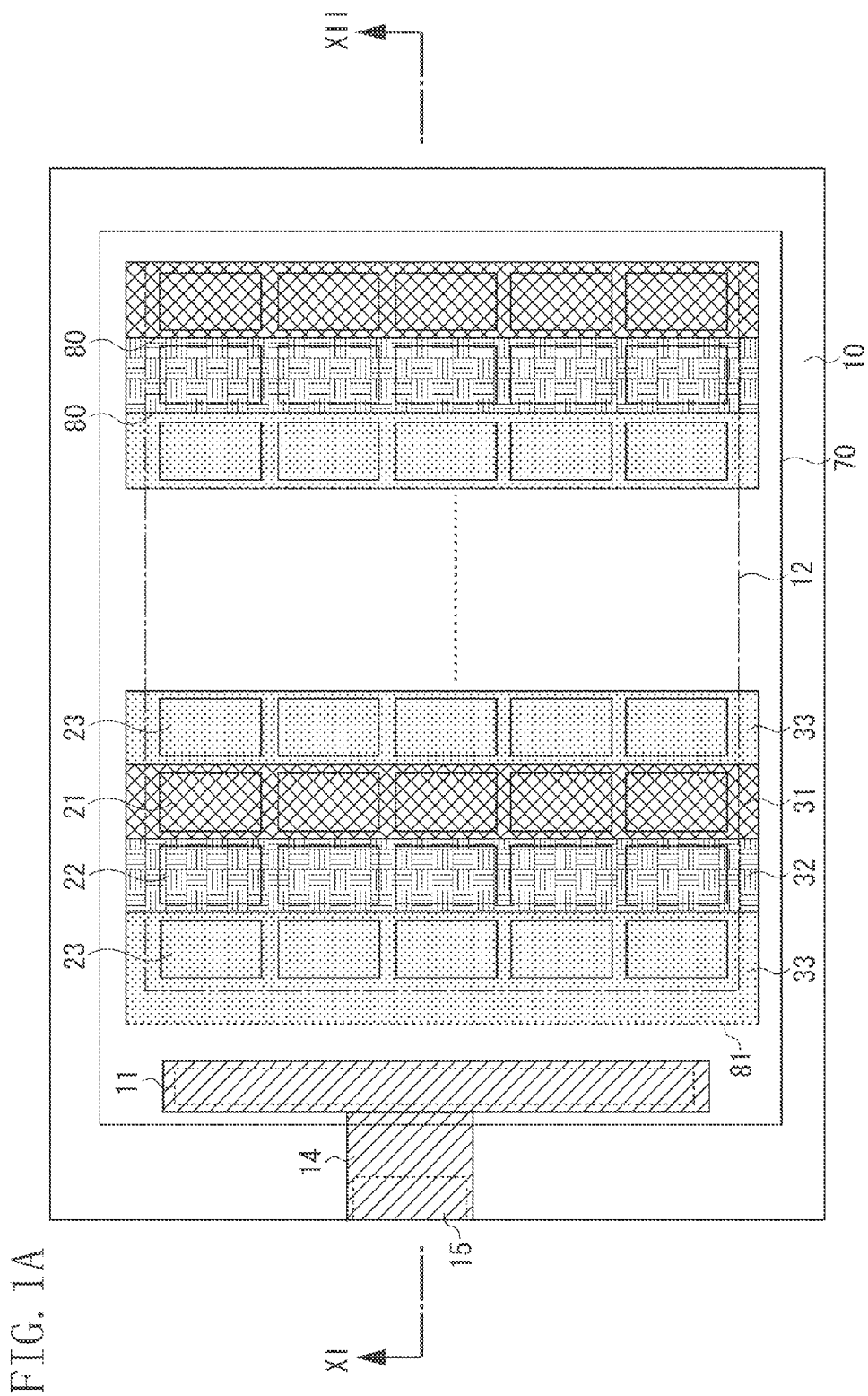

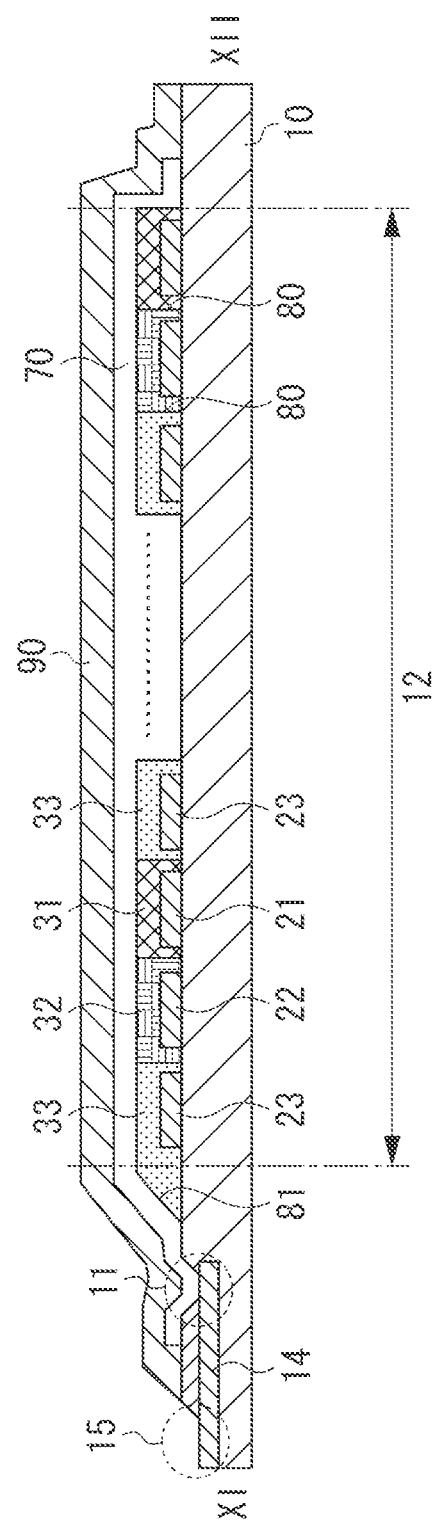

ORGANIC LUMINESCENT DEVICE AND METHOD FOR MANUFACTURING THE SAME

BACKGROUND OF THE INVENTION

1. Field of the Invention

One disclosed aspect of the embodiments relates to a luminescent device capable of displaying at least two different colors, and particularly to an organic electroluminescent (EL) device including at least a first EL element and a second organic EL element, each of which emits light of a different color.

2. Description of the Related Art

In a method for manufacturing an organic EL device capable of displaying a plurality of colors, a shadow mask is widely used to selectively form a luminescent layer that emits a specific color in a specific area. Meanwhile, high-definition luminescent devices exceeding 300 pixels per inch (ppi) has been recently demanded, and it is becoming increasingly difficult to manufacture such luminescent devices by using the conventional shadow mask. Japanese Patent No. 4578026 discusses, as a technique capable of miniaturization, a method in which luminescent layers are selectively formed by patterning using photolithography.

Japanese Patent No. 4578026 discusses a method in which a desired pattern of resist is formed on a luminescent layer by photolithography, and the luminescent layer in the areas where the resist is not formed is removed by wet etching or dry etching. In this way, luminescent layers may be selectively formed. An end portion of the luminescent layers patterned in such method may be formed to have a smaller inclined area, compared with an end portion of the luminescent layers selectively formed by using a shadow mask. The inclined area is an area where the thickness of the film is decreased toward an end portion of the film. In other words, the inclined area is an area that is inclined with respect to a substrate.

If a film is formed by using a shadow mask, depending on the distance between the shadow mask and the film formation surface and on the incident angle of deposited particles incident on the film formation surface, an inclined area having a width several times to several dozen times the thickness of the formed film is formed at a film end portion that is formed at an opening of the shadow mask. In contrast, if a film is patterned by using photolithography and etching, the inclined area may be formed to have a width less than or equal to the thickness of the formed film.

In particular, if dry etching is used, since the etching may be performed in the approximately vertical direction with respect to the substrate, a film end portion may have a large inclination angle of 60 to 90 degrees with respect to the substrate, and the inclined area may be formed to have a width narrower than the film thickness. If luminescent layers arranged in an element area of the luminescent device are patterned by photolithography, the distance between luminescent layers adjacent to each other may be reduced. Thus, organic EL elements may be densely arranged. This is advantageous in reducing the size of the luminescent device and improving the aperture ratio of the light emitting elements. In one embodiment, the element area means an area where a plurality of display-related organic EL elements is formed. In addition, the thickness of the formed film means an average of the film thickness measured at a plurality of positions other than the inclined area.

Power for driving the luminescent device is supplied from an external power source via an external connection terminal previously provided outside the element area. Two electrodes for the external connection terminal and the organic EL elements are electrically connected via a wiring. A switching element such as a transistor may be provided in the wiring, as long as the two electrodes for the external connection terminal and the organic EL elements may be electrically connected when necessary. Generally, the wiring and a second electrode formed after the luminescent layers are patterned are electrically connected via a contact portion. The contact portion is formed outside the element area by removing high-resistance material such as that of a luminescent layer formed on a wiring layer. In addition, organic material such as that of a luminescent layer is removed from the surface of the external connection terminal so that the external connection terminal is electrically connected to the external power source. The organic material is also removed such that the removed area surrounds the luminescent area so that a pathway of moisture intruding from the outside to the organic EL elements is cut off.

If the luminescent layer outside the element area (such as the contact portion) is removed simultaneously when the luminescent layers within the element area are patterned, the manufacturing process may be advantageously simplified. However, the end portions of the luminescent layers outside and inside the element area are etched under the same conditions, the end portions are formed similarly to the inside the element area to have a large inclination angle with respect to the substrate. If an area having a large inclination angle with respect to the substrate exists on the surface on which the second electrode is to be formed, the second electrode could be disconnected or the film thickness of the second electrode could be thinned, then resistance may increase. Particularly, when the second electrode is formed by a high-directivity deposition method or is formed to have a thin film thickness, if an area having an inclination angle as large as 90 degrees exists on the surface on which the second electrode is formed, the second electrode is highly likely to have high resistance. If the second electrode is disconnected or the film thickness is thinned, a current flowing from the second electrode to the wiring layer through a luminescent element is subjected to high wiring resistance. Consequently, various problems are caused. In some cases, the luminescent device does not turn on. In other cases, the luminescent device exhibits defective light emission such as shading or undergoes a voltage increase.

SUMMARY OF THE INVENTION

A disclosed aspect of the embodiments is directed to allowing a luminescent device including luminescent layers patterned by photolithography to prevent exhibiting defective light emission or undergoing a voltage increase attributable to, for example, disconnection or resistance increase of the second electrode, while utilizing advantages of photolithography such as reduction in the pixel size and improvement in the aperture ratio.

According to an aspect of the embodiments, there is provided a luminescent device including a substrate on which an external connection terminal and a wiring layer electrically connected to the external connection terminal, and an element area in which a plurality of luminescent elements are formed. Each of the luminescent elements sequentially includes a first electrode, an organic compound layer patterned by photolithography, and a second electrode. The second electrode is continuously formed in the plurality of the luminescent elements and is electrically connected to the wiring layer via a contact portion formed outside the element area. Among the end portions of the plurality of organic compound layers patterned, an end portion that is not located between luminescent elements and that is located in an area covered by the second electrode has a smaller inclination angle than that of any other end portion located between luminescent elements.

The luminescent device according to one embodiment includes luminescent layers patterned by photolithography, and an end portion of an organic compound layer that is not located between organic EL elements is formed to have a smaller inclination angle in the inclined area with respect to the substrate (herein after referred to as inclination angle). Thus, while utilizing advantages of photolithography such as reduction of the size and improvement of the aperture ratio, one embodiment may prevent defective light emission or a voltage increase attributable to disconnection or resistance increase of the second electrode caused in the inclined area outside the element area.

Further features and aspects of the disclosure will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the embodiments and, together with the description, serve to explain the disclosure.

FIGS. 1A and 1B are schematic drawings illustrating a luminescent device.

DESCRIPTION OF THE EMBODIMENTS

Figure 2A:
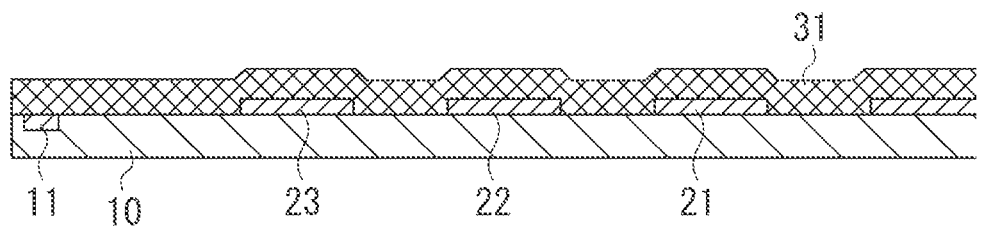
FIGS. 2A, 2B, 2C, 2D, 2E, 2F, 2G, 2H, 2I, 2J, 2K, 2L, 2M, 2N, 2O, and 2P are schematic cross sections simply illustrating a manufacturing method.

Various exemplary embodiments, features, and aspects of the embodiments will be described in detail below with reference to the drawings.

Conventional techniques in the relevant technical field may be applied to what is not particularly illustrated or described in this specification. In addition, while the disclosure will be hereinafter described based on the following exemplary embodiments, the disclosure is not limited thereto. Various modifications may suitably be made within the technical scope of the embodiments.

FIG. 1A is a schematic plan view illustrating a luminescent device, and FIG. 1B is a schematic cross section illustrating the luminescent device taken along line XI-XII in FIG. 1A. An external connection terminal 15 and a wiring 14 that is electrically connected to the external connection terminal 15 are formed outside an element area 12 of a substrate 10. Organic EL elements are formed in the element area 12. The substrate 10 includes a supporting member, transistors controlling the organic EL elements, a circuit layer including control lines and signal lines supplying signals to the transistors, and wirings connecting the external connection terminal 15 and first electrodes, and an insulating layer covering the circuit layer (these constituent elements of the substrate 10 are not illustrated). The external connection terminal 15 electrically connected to an external wiring and part (contact portion 11) of the wiring 14 electrically connected to a second electrode have respective surface whose insulating layer is removed.

A plurality of first electrodes (lower electrodes) 21 to 23 are formed in row direction and column direction on the substrate 10 for each organic EL element. Each of the first electrodes 21 to 23 is electrically connected to the circuit layer via a contact hole (not illustrated) formed in the insulating layer covering the circuit layer. First to third organic compound layers 31 to 33 including at least first to third luminescent layers are formed on the first electrodes 21 to 23, respectively. Each of the first to third luminescent layers emits light of a different color. Thus, by using layers that emit light of red (R), green (G), and blue (B), the luminescent device may display a full-color image.

A second electrode (upper electrode) 70 is continuously formed on the first to third luminescent layers across a plurality of organic EL elements. Thus the organic EL element is completed. The organic EL element described here is configured to include the first electrodes, the second electrode, and an organic compound layer sandwiched between the first electrode and the second electrode. In addition, each organic EL element emits light, in response to a signal input to the circuit layer from the outside. In addition, the second electrode 70 is continuously formed from the element area 12 to the contact portion 11 of the wiring 14 and is electrically connected to the wiring 14 at the contact portion 11. Above described configuration enables a current for causing the organic EL elements to emit light to flow via the external connection terminal 15.

Since organic EL elements including organic compound layers are significantly deteriorated by moisture, a sealing layer 90 for preventing moisture intruding into the element area 12 from the outside is formed to cover the organic EL elements. In addition, since moisture may easily penetrate organic material such as that of the organic compound layers, in order to prevent moisture penetrating the element area 12 from the outside via the organic compound layers, the organic compound layers need to be removed such that the removed area surrounds the element area 12. Namely, moisture penetration paths need to be eliminated.

Thus, if the second electrode 70 is continuously formed from the element area 12 to the contact portion 11, the second electrode 70 is certainly formed across an end portion of an organic compound layer that is not located between organic EL elements. Namely, the inclination angle of an organic compound layer end portion that is not located between organic EL elements affects the resistance of a current path along which a current flows from the second electrode 70 to a wiring layer through an organic EL element (wiring resistance between the organic EL element and the contact portion 11).

In the embodiments, each organic compound layer is patterned by photolithography. Generally, when films are patterned by photolithography, each film is patterned into a desired pattern in a single photolithography process. Thus, since all the end portions of such film are etched under the same conditions, the end portions have approximately the same inclination angle. In the embodiments, if each organic compound layer is formed into a desired pattern in a single photolithography process, since the end portions of the organic compound layers formed inside and outside the element area 12 are etched under the same conditions, both end portions have approximately the same inclination angle. Namely, regardless of whether the end portion is formed inside or outside the element area 12, both organic compound layers have an end portion with a large inclination angle.

Thus, since the second electrode 70 formed across the end portions of the organic compound layers are easily disconnected or the film thickness is thinned at such end portions with a large inclination angle, the wiring resistance between an organic EL element and the contact portion 11 could be increased.

While organic compound layer patterning methods using photolithography will be described in detail below, an inclined end portion of an organic compound layer located between organic EL elements is formed to be in contact with an organic compound layer of an adjacent organic EL element, as illustrated in FIG. 1B. Thus, since such end portions having a large inclination angle, which is a cause of disconnection or thinning of the second electrode 70, are not exposed, the wiring resistance between an organic EL element and the contact portion 11 is not significantly increased within the element area 12. In contrast, since no organic compound layer is adjacent to an end portion of an organic compound layer that is not located between organic EL elements, the end portion is exposed as it is after patterned. As described above, the second electrode 70 is formed across the organic compound layer end portion that is outside the element area 12 and that is not located between organic EL elements. Namely, since the second electrode 70 is easily disconnected or thinned at such end portion that is not located between organic EL elements and that has a large inclination angle, the wiring resistance between an organic EL element and the contact portion 11 could be increased significantly.

Based on the luminescent device according to the embodiments, as illustrated in FIG. 1B, the organic compound layer end portion that is not located between organic EL elements has a smaller inclination angle with respect to the substrate 10, compared with inclination angle located between organic EL elements. Above configuration prevents disconnection or thinning of the second electrode 70 at the organic compound layer end portion that is not located between organic EL elements, even if the second electrode 70 is continuously formed from the element area 12 to the contact portion 11. As a result, it is possible to prevent a significant increase of the wiring resistance between an organic EL element and the contact portion 11, so that defective light emission or a voltage increase is prevented. Namely, the embodiments may provide a luminescent device capable of emitting uniform light with low power.

While the luminescent device in FIGS. 1A and 1B includes three types of organic EL elements each including a different luminescent layer, the luminescent device may include two types of organic EL elements or four or more types of organic EL elements. Here, the "different luminescent layer" means that at least either one of a material or a film thickness constituting the luminescent layer is different.

Figure 2B:
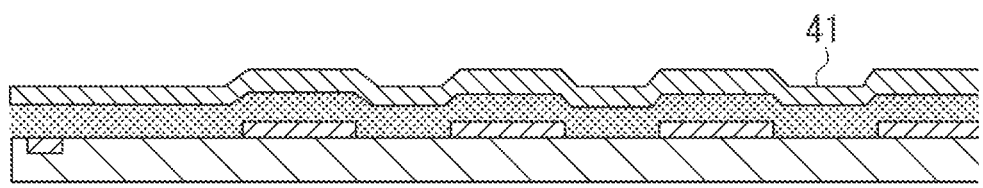
Figure 2C:
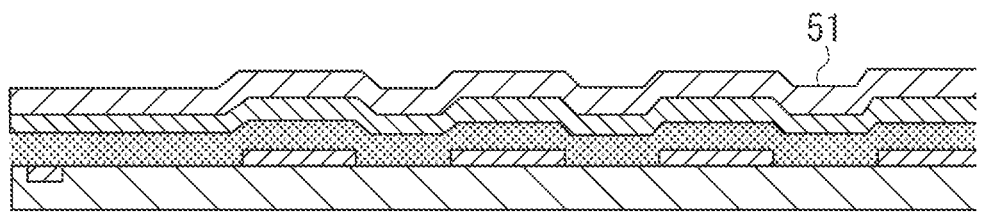

Next, a luminescent device manufacturing method will be described. FIGS. 2A to 2P are schematic cross sections illustrating a luminescent device manufacturing method. For simplicity, FIGS. 2A to 2P illustrate only part of the luminescent device, that is, an area including the contact portion 11 and three organic EL elements (one from each of the three types).

Hereinafter, a process for manufacturing the first electrodes 21, 22 and 23 will be described. First, as illustrated in FIG. 2A, the first electrodes 21 to 23 and the contact portion 11, which connects the wiring 14 (not illustrated) electrically connected to the external connection terminal 15 and the second electrode 70 that is formed subsequently, are formed on the substrate 10. Next, the first organic compound layer 31 including at least a first luminescent layer is formed on the substrate 10. The substrate 10 includes the supporting member, the circuit layer formed on the supporting member, the insulating layer formed on the circuit layer, and a contact hole electrically connecting the circuit layer and an organic EL element. An insulating substrate such as a glass substrate, a semiconductor substrate such as a silicon substrate, or a metal substrate having an insulating layer on a surface thereof may suitably be used as the supporting member.

If the luminescent device is of a top emission type, a metal material that reflects light, such as aluminum (Al), silver (Ag), or an alloy of such element, may suitably be used as each of the first electrodes 21 to 23. Alternatively, a multilayer electrode of a metal layer and a conductive oxide layer such as indium oxide may suitably be used. If the luminescent device is of a bottom emission type, a material that transmits light needs to be used as the first electrode. For example, indium oxide or indium zinc oxide may suitably be used. If the luminescent device is of a bottom emission type, a transparent base material such as glass is used as the supporting substrate.

Next, a process for manufacturing the first organic compound layer 31 will be described. The first organic compound layer 31 is formed in the element area 12 of the substrate 10 where the first electrodes 21 to 23 are formed. A conventional method such as a vacuum deposition method or a spin coating method may be used to form the organic compound layer 31. If a vacuum deposition method is used, an area mask having openings corresponding to the element area 12 in which the first electrodes 21 to 23 are formed may be used to selectively form the organic compound layer 31. Alternatively, the organic compound layer 31 may be formed on the entire substrate 10 without using a mask.

An organic compound layer included in each organic EL element includes at least a luminescent layer that emits light of a predetermined color. Specifically, the organic compound layer includes one or a plurality of luminescent layers, or in addition to such luminescent layers, the organic compound layer may have a multilayer structure including at least one layer of another layer including an electron injection layer, an electron transport layer, a hole injection layer, and a hole transport layer. To cause the first to third organic EL elements 31 to 33 to display colors different from each other, an organic compound layer different from each other needs to be included in the first to third organic EL elements 31 to 33. In the embodiments, "an organic compound layer different from each other" means that organic compound layers are different from each other in at least one of the material, the composition, and the thickness of the luminescent layer, the method and condition for forming the luminescent layer, the materials, the compositions, and the thicknesses of layers other than the luminescent layer, and the method and condition for forming the other layers. For example, if each of the first to third organic compound layers 31 to 33 is formed to have a multilayer structure of a luminescent layer and a functional layer, only the luminescent layer may be different among the first to third organic EL elements. In this case, after a photolithography process is repeated to pattern the first to third organic compound layers 31 to 33 in which the respective luminescent layers are laminated, the functional layer common to the first to third organic EL elements may be continuously formed on the first to third organic EL elements.

While a combination of colors of light emitted by the luminescent layers included in each of the organic compound layers 31 to 33 is not particularly limited, a combination of three colors R, G, and B is most common.

Next, a process for patterning the first organic compound layer 31 will be described. As illustrated in FIGS. 2B and 2C, a first intermediate layer 41 and a first resist layer 51 are formed in this order on the first organic compound layer 31. The first intermediate layer 41 serves as a protective layer for preventing solvent included in resist material of the first resist layer 51 and resist developer therefor from affecting the first organic compound layer 31. In addition, in a subsequent process, the first intermediate layer 41 also serves as a layer for removing layers formed on the first intermediate layer 41 by dissolving the first intermediate layer 41. Thus, a suitable material needs to be selected as the first intermediate layer 41 so that the first intermediate layer 41 prevents the solvent included in the resist material of the first resist layer 51 and resist developer therefor from intruding into the first organic compound layer 31 and so that solution used to remove the first intermediate layer 41 does not affect the first organic compound layer 31.

For example, water-soluble polymer or water-soluble inorganic salt may be used as the first intermediate layer 41, to serve as a layer for removing layers formed on the first intermediate layer 41. However, if the first intermediate layer 41 is made of water-soluble material, for example, there is fear that the first intermediate layer 41 could be dissolved or swelled in a process of forming the first resist layer 51 or in a developing process. Thus, the first intermediate layer 41 may be made as a multilayer structure having a layer of water-soluble material and a layer protecting the layer of water-soluble material from processes. The layer of water-soluble material is formed on a side near to the first organic compound layer 31. Water-insoluble material may be used as the layer protecting the layer of water-soluble material. More specifically, silicon oxide or silicon nitride may suitably be used.

The layer of water-soluble polymer of the first intermediate layer 41 may be formed by a coating method such as a spin coating method or a dip coating method, for example. The layer of water-soluble inorganic salt of the first intermediate layer 41 may be formed by a coating method or a vacuum deposition method, for example. Depending on the material used to form the layer, a suitable method may be selected from conventional methods. If the layer of water-insoluble material is formed, other than a coating method, a suitable vacuum film formation method may be selected from various conventional methods such as a vacuum deposition method, a sputtering method, and a chemical vapor deposition (CVD) method.

If the first organic compound layer 31 is insoluble in solvent included in resist material of the first resist layer 51 and resist developer therefor, formation of the first intermediate layer 41 may be omitted. The same applies to photolithography processes for other organic compound layers.

A conventional photosensitive material may be used for the first resist layer 51. While a positive resist is used in the manufacturing method illustrated in FIGS. 2A to 2P, a negative resist may be used, instead. The first resist layer 51 may be formed by a conventional method such as a spin coating method, a dip coating method, or an ink-jet method.

Figure 2D:
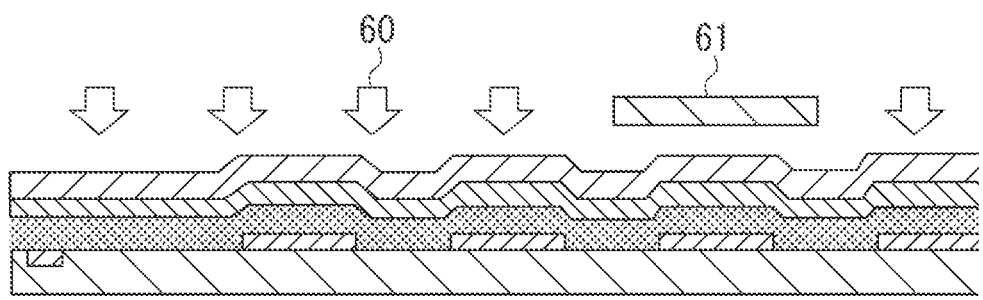

Next, as illustrated in FIG. 2D, the substrate 10 is irradiated with ultraviolet rays 60 via a first photomask 61 for shielding the area where the first electrode 21 is formed. As a result, the first resist layer 51 corresponding to the remaining area where the first electrode 21 is not formed is exposed. If the first resist layer 51 is a negative resist, a photomask having an opening that corresponds to the area where the first electrode 21 is formed is used.

Figure 2E:
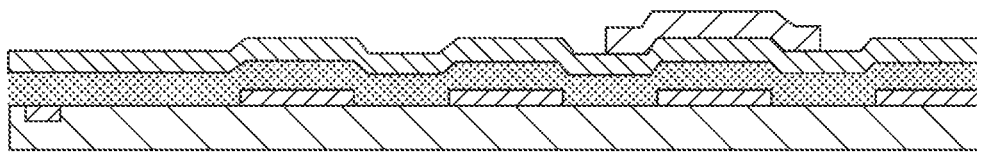
Figure 2F:
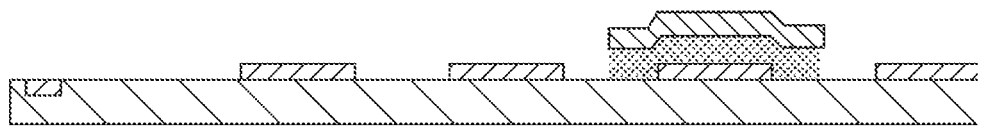

Next, after the exposure, the substrate 10 is soaked in developer to remove the first resist layer 51 corresponding to the exposed area, as illustrated in FIG. 2E. Next, by using the remaining first resist layer 51 as a mask, the first intermediate layer 41 and the first organic compound layer 31 corresponding to the area where the first resist layer 51 has been removed are etched and removed, as illustrated in FIG. 2F. As long as the first organic compound layer 31 formed on the first electrode 21 is not affected, the remaining first resist layer 51 used as a mask and part of the first intermediate layer 41 thereunder may be removed simultaneously.

The first organic compound layer 31 may be etched by wet etching in which solvent for dissolving the first organic compound layer 31 is used or by dry etching in which gas that reacts with material of the first organic compound layer 31 is used. However, if the first organic compound layer 31 is etched by wet etching in which solvent is used, the sides of the first organic compound layer 31 under the first resist layer 51 are also etched to some extent. Thus, dry etching by which the sides of the first organic compound layer 31 are etched very little is more suitable. Since dry etching allows the end portions of the first organic compound layer 31 to have a larger inclination angle, dry etching is more suitable.

Figure 2G:
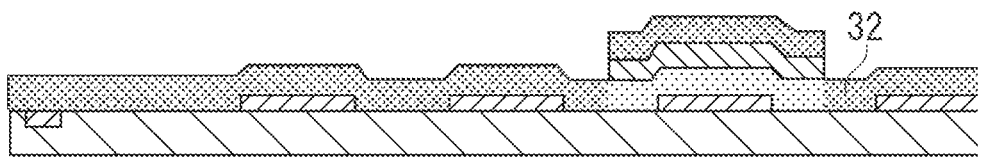

Next, a process for forming the second organic compound layer 32 will be described. As illustrated in FIG. 2G, the second organic compound layer 32 including a second luminescent layer is formed at least on the first electrode 22, leaving the first intermediate layer 41 on the patterned first organic compound layer 31. The second organic compound layer 32 may be formed as in the case of the first organic compound layer 31. Since the second organic compound layer 32 is formed to cover the end portions of the first organic compound layer 31, end portions of the first and second organic compound layers 31 and 32 located between the first and second organic EL elements are in contact with each other. As a result, the greatly inclined end portions of the first organic compound layer 31 are not directly exposed.

Figure 2H:
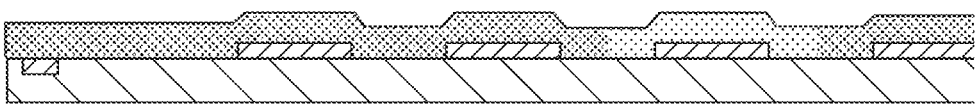

Next, a process for patterning the second organic compound layer 32 will be described. The substrate 10 on which the second organic compound layer 32 has been formed is soaked in solvent of the first intermediate layer 41, to remove the first intermediate layer 41 together with the second organic compound layer 32 formed thereon, as illustrated in FIG. 2H. As a result, the first organic compound layer 31 is formed on the first electrode 21, and the second organic compound layer 32 is formed on the other first electrodes 22 and 23.

Figure 2I:
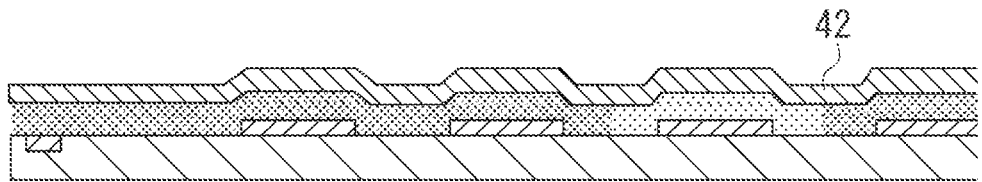
Figure 2J:
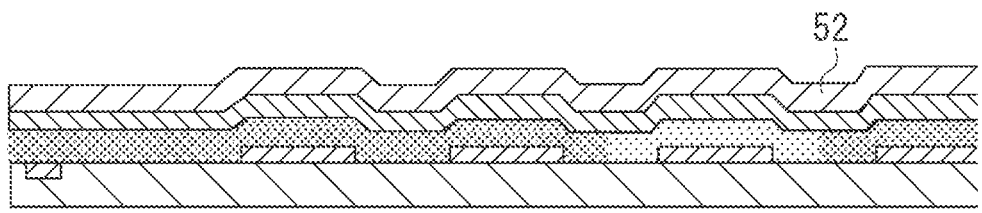

Next, as illustrated in FIG. 2I, a second intermediate layer 42 is formed on the first and second organic compound layers 31 and 32. Next, as illustrated in FIG. 2J, a positive type second resist layer 52 is formed on the second intermediate layer 42. The material of the second intermediate layer 42 and the method for forming the second intermediate layer 42 are similar to those of the first intermediate layer 41. If the first and second organic compound layers 31 and 32 are insoluble in solvent of the second resist layer 52 and developer therefor, formation of the second intermediate layer 42 may be omitted.

Figure 2K:
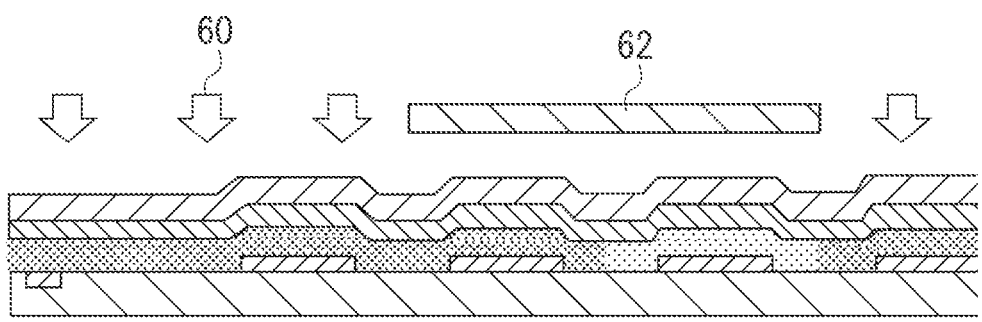
Figure 2L:
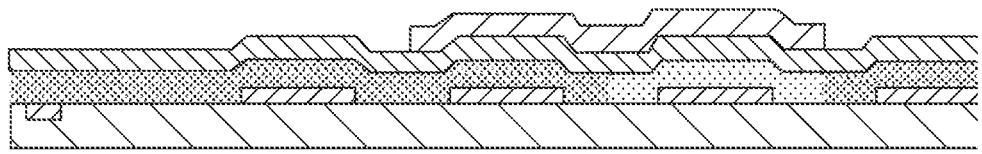
Figure 2M:
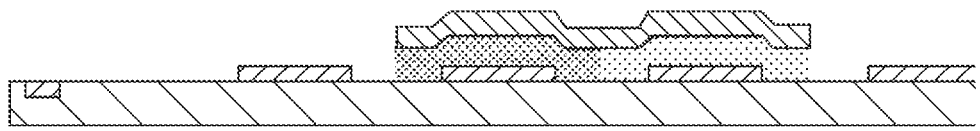

Next, as illustrated in FIG. 2K, the substrate 10 is irradiated with ultraviolet rays 60 via a second photomask 62 shielding the area where the first and second electrodes 21 and 22 are formed. As a result, the second resist layer 52 formed in an area other than the area where the first and second electrodes 21 and 22 are formed is exposed. Next, as illustrated in FIG. 2L, the substrate 10 is soaked in developer to remove the second resist layer 52 remaining in the exposed area. Next, as illustrated in FIG. 2M, the remaining second resist layer 52 is used as a mask, to remove the second intermediate layer 42 and the second organic compound layer 32 in the area where the second resist layer 52 has been removed. The second organic compound layer 32 may be removed as in the case of the first organic compound layer 31. As long as the first and second organic compound layers 31 and 32 on the first and second electrodes 21 and 22 are not affected, the remaining second resist layer 52 used as a mask and part of the second intermediate layer 42 thereunder may be removed simultaneously.

Figure 2N:
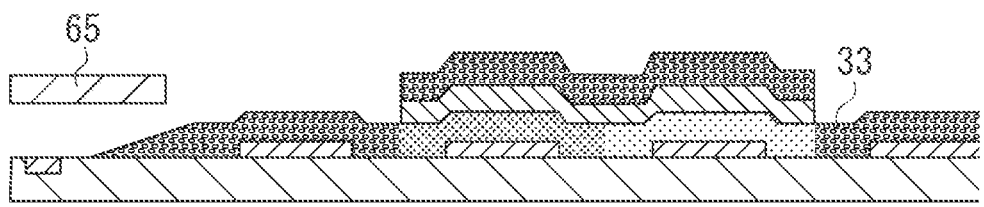
Figure 2O:
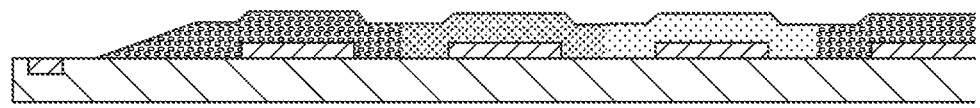
Figure 2P:
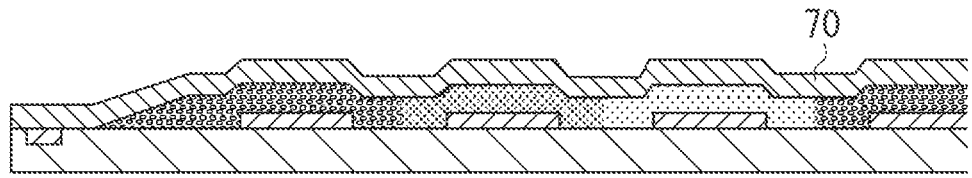

Hereinafter, a process for manufacturing the third organic compound layer 33 will be described. Next, the third organic compound layer 33 including a third luminescent layer is formed on the first electrode 23, as illustrated in FIG. 2N. In the present exemplary embodiment, as illustrated in FIGS. 2A to 2P, since the third organic compound layer 33 formed last is not located between organic EL elements, the third organic compound layer 33 has an end portion that is not in contact with other organic compound layers. Thus, the third organic compound layer 33 is formed by a vacuum deposition method using a mask 65 so that the end portion of the third organic compound layer 33 that is not located between organic EL elements has a smaller inclination angle than that of the end portions patterned by photolithography. More specifically, the mask 65 having an opening that corresponds to the element area 12 is prepared, the mask 65 and the substrate 10 are aligned so that an end portion of the opening of the mask 65 is located between the contact portion 11 and the element area 12, and a vacuum deposition method is executed to form the third organic compound layer 33.

Generally, in a vacuum film formation method using a mask, film formation particles enter a gap formed between the mask and the film formation surface, and depending on the distance between the mask and the film formation surface and on the incident angle of the film formation particles attached to the film formation surface, an inclination area, which has a film thickness that gradually decreases in the vicinity of the end portion of the opening of the mask 65, is formed. Thus, by adjusting the distance between the mask and the film formation surface and the incident angle of the film formation particles attached to the film formation surface, the inclination angle of the end portion of the organic compound layer may be controlled. In addition, if the mask is used, the third organic compound layer 33 is not formed in unnecessary areas. Thus, since the elements are immune from moisture intrusion into the element area 12 from the outside via any organic compound layer, a process of removing an organic compound layer such that the removed area surrounds the element area 12 may be omitted.

Since the third organic compound layer 33 is formed to cover end portions of the first and second organic compound layers 31 and 32, an end portion of each luminescent layer located between the first/second and third organic EL elements comes into contact with each other. Namely, no end portion having a large inclination angle is exposed.

A process for patterning the third organic compound layer 33 will be described. The substrate 10 on which the third organic compound layer 33 has been formed is soaked in solvent of the second intermediate layer 42, to dissolve the second intermediate layer 42 formed on the first electrodes 21 and 22 and to remove the third organic compound layer 33 formed thereon, as illustrated in FIG. 2O.

A process for manufacturing the second electrode 70 will be described. Finally, as illustrated FIG. 2P, the second electrode 70 that extends to the plurality of organic EL elements and the contact portion 11 is formed on the first to third organic compound layers 31 to 33. In this way, organic EL elements are completed.

Since the inclination angle of an end portion of the third organic compound layer 33, which is not located between organic EL elements and on which the second electrode 70 is formed, remains similar to the end portion which is formed using a mask, the end portion has a smaller inclination angle than that of an end portion located between organic EL elements, as illustrated in FIG. 2P. Namely, among the end portions of the patterned organic compound layers 31 to 33, an end portion of the organic compound layer 33 which is not located between organic EL elements and on which the second electrode 70 is formed to have a smaller inclination angle than that of any other end portion located between organic EL elements. Other areas than the area illustrated in FIG. 2P include such end portion which is not located between organic EL elements and on which the second electrode 70 is formed. However, not all the end portions in such areas need to have a smaller inclination angle than that of any other end portion located between organic EL elements. It is only necessary that apart of end portion have a smaller inclination angle. In addition, as illustrated in FIG. 2P, if an end portion of the organic compound layer 33 located along the side on which the contact portion 11 is formed has a smaller inclination angle, the wiring resistance may be advantageously reduced. However, this is not a requirement. It is only necessary that the element area 12 and the contact portion 11 be electrically connected at least at one portion and that the wiring resistance between an organic EL element and the contact portion 11 be sufficiently small.

Thus, the first or second organic compound layer 31 or 32 may be formed by a vacuum deposition method using a mask and be patterned by etching so that at least part of an end portion of the organic compound layer formed by a vacuum film formation method remains as it is in an area that is not between organic EL elements.

A vacuum deposition method using a mask is suitable, since the inclination angle of an end portion of the organic compound layer that is not located between organic EL elements may be made smaller, without increasing the number of processes.

Based on the luminescent device, since end portions of an organic compound layer located between organic EL elements are in contact with adjacent end portions, an area having a large inclination angle is not formed. In addition, since an end portion of the third organic compound layer 33 that is not located between organic EL elements has a smaller inclination angle, there is no concern of the second electrode 70 being disconnected or thinned. As a result, an increase in the sheet resistance of the second electrode 70 between the second electrode 70 and the contact portion 11 is prevented, and the luminescent device does not exhibit defective light emission or undergo a voltage increase.

When manufacturing a luminescent device including four types of organic compound layers, namely, an organic EL device including an organic EL element having a fourth organic compound layer, similar processes to those illustrated in FIGS. 2G to 2M may be added. Thus, the luminescent device may be manufactured. When manufacturing an organic EL device including two types of organic compound layers, the processes illustrated in FIGS. 2G to 2M may be omitted.

A luminescent device manufacturing method has thus been described. However, alternatively, the inclination angle of an organic compound layer end portion that is not located between organic EL elements may be formed by adjusting dry etching process conditions. Next, another manufacturing method will be described with reference to FIGS. 3A to 3H. Aspects identical to those of the manufacturing method illustrated in FIGS. 2A to 2P will not be redundantly described. The following description will be made with a focus on the aspects different from the above manufacturing method. In addition, members in FIGS. 3A to 3H identical to those in FIGS. 2A to 2P are denoted by the same numerals, and redundant description thereof will be avoided.

Figure 3A:
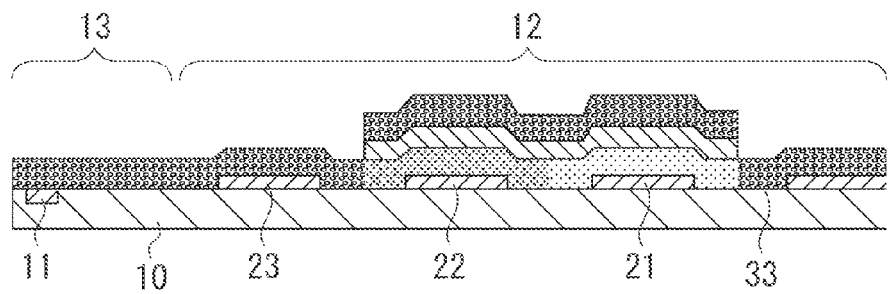
FIGS. 3A 3B, 3C, 3D, 3E, 3F, 3G, and 3H are schematic cross sections simply illustrating another manufacturing method.
Figure 3B:
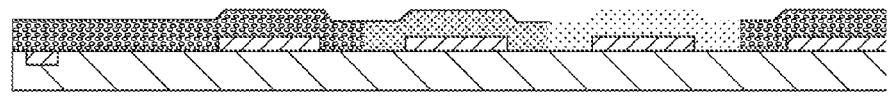

The manufacturing method in FIGS. 2A to 2M is used until the second organic compound layer 32 is formed. After the first electrode 23 is exposed, unlike the manufacturing method in FIGS. 2M to 2P, no deposition mask is used. Instead, as illustrated in FIG. 3A, the third organic compound layer 33 is formed on the entire substrate 10. Next, as illustrated in FIG. 3B, the third organic compound layer 33 formed on the first electrodes 21 and 22 is removed together with the second intermediate layer 42.

Figure 3C:
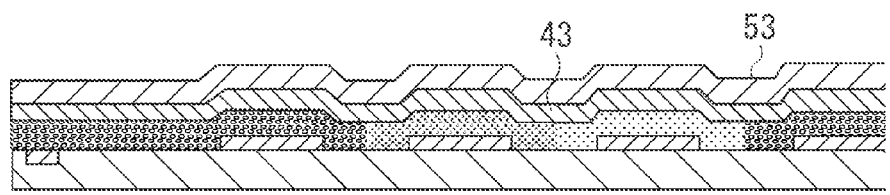
Figure 3D:
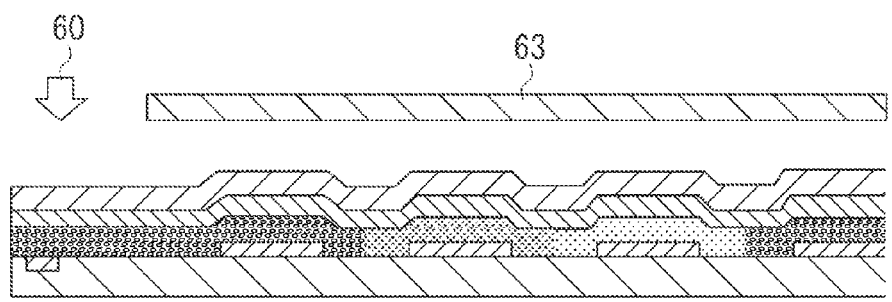
Figure 3E:
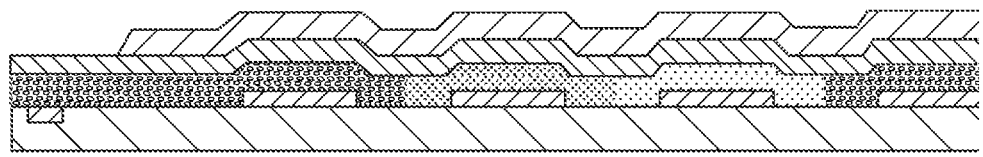

Next, as illustrated in FIG. 3C, a third intermediate layer 43 and a third resist layer 53 are formed, and as illustrated in FIG. 3D, the substrate 10 is irradiated with the ultraviolet rays 60 via a shielding area 63 (a third photomask) shielding the element area 12. Next, as illustrated in FIG. 3E, the substrate 10 is soaked in developer, to develop the third resist layer 53 in the exposed area and to remove the third resist layer 53 at the area surrounding the element area 12 and on the contact portion 11.

Figure 3F:
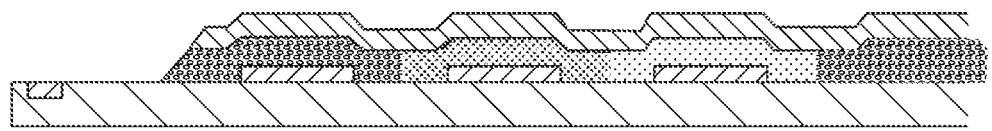

Next, as illustrated in FIG. 3F, the third intermediate layer 43 and the third organic compound layer 33 are removed by dry etching, using the remaining third resist layer 53 as a mask. For example, by adjusting the pressure in the dry etching process, an end portion of the organic compound layer to be patterned may be formed to have a small inclination angle.

Figure 3G:
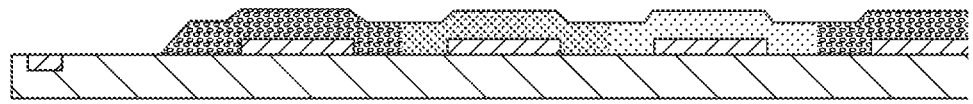
Figure 3H:
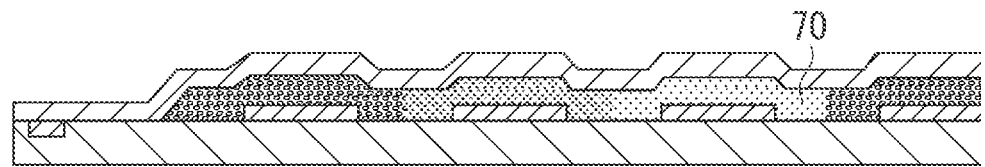

After the third organic compound layer 33 is patterned, the third intermediate layer 43 is dissolved and removed, as illustrated in FIG. 3G. Finally, as in FIGS. 2A to 2P, the second electrode 70 is formed as illustrated in FIG. 3H. In this way, the luminescent device is completed. In FIG. 3G, the third resist layer 53 has already been etched and removed by the previous dry etching process. However, even if the third resist layer 53 still remains after the dry etching process, the third resist layer 53 may be removed simultaneously when the third intermediate layer 43 is dissolved and removed.

The number of processes of the manufacturing method in FIGS. 3A to 3H is greater than that of the manufacturing method in FIGS. 2A to 2P. However, the position and the angle of the end portion of the organic compound layer may be controlled more accurately, compared with the manufacturing method in FIGS. 2A to 2P. Thus, the width of the inclined end portion may be narrowed, so that the peripheral area, or the frame, may be reduced.

Figure 5:
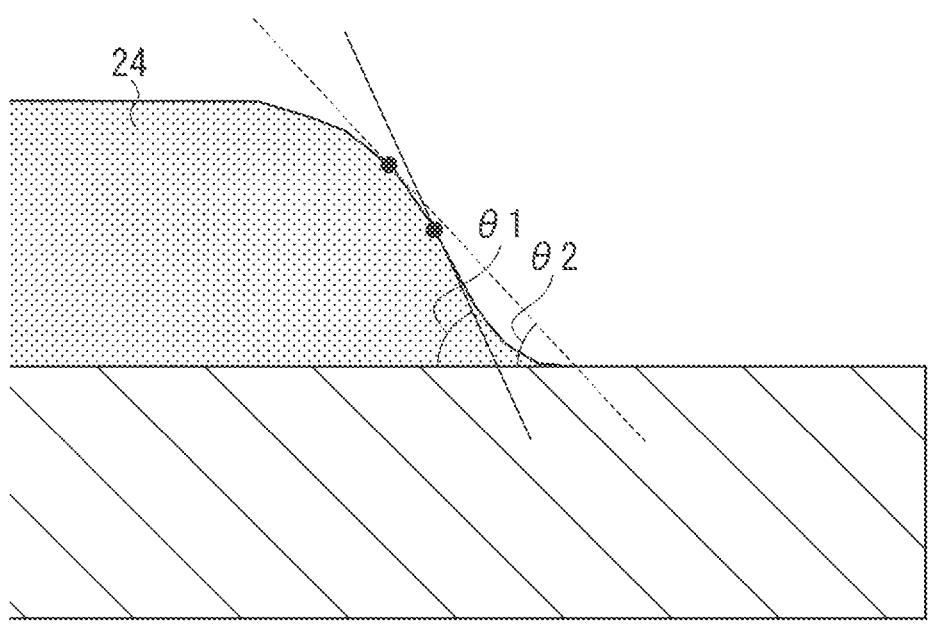
FIG. 5 illustrates an inclination angle of an end portion of an organic compound layer.

The end portions of an organic compound layer formed in a single patterning process are formed to have approximately the same inclination angle anywhere in a plane. Thus, an inclination angle at a representative one position from respective positions may be used as the inclination angle. If the inclination angle varies depending on patterning conditions, an average of the inclination angles at a plurality of positions may be used. As illustrated in FIG. 5, if inclination angles at an end portion of an organic compound layer 24 is not constant, among the angles of tangent lines at the individual points on the inclined portion with respect to the substrate 10, the largest inclination angle is used as the inclination angle. In FIG. 5, inclination angle $\theta 1$ is used as the inclination angle of the organic compound layer 24.

After the first to third organic compound layers 31 to 33 are patterned and before the second electrode 70 is formed, a continuous common organic compound layer on the element area 12 may be additionally stacked. In this case, an organic compound layer end portion signifies an end portion including the end portions of the original organic compound layer and the topmost organic compound layer stacked thereon, and the largest inclination angle is used as the inclination angle of the end portion. A cross section of such organic compound layer end portion may be exposed by a conventional method such as focused ion beam (FIB) processing, and the inclination angle may be observed and checked by a conventional method such as scanning electron microscopy (SEM).

Next, patterning layouts of the organic compound layers in the luminescent device will be described. FIGS. 4A to 4D are schematic plan views illustrating layouts of the organic compound layers. In FIGS. 4A to 4D, a dotted line 81 represents an end surface of an organic compound layer that is not located between organic EL elements and that has a smaller maximum inclination angle than that of any other end surface located between the organic EL elements.

Figure 4A:
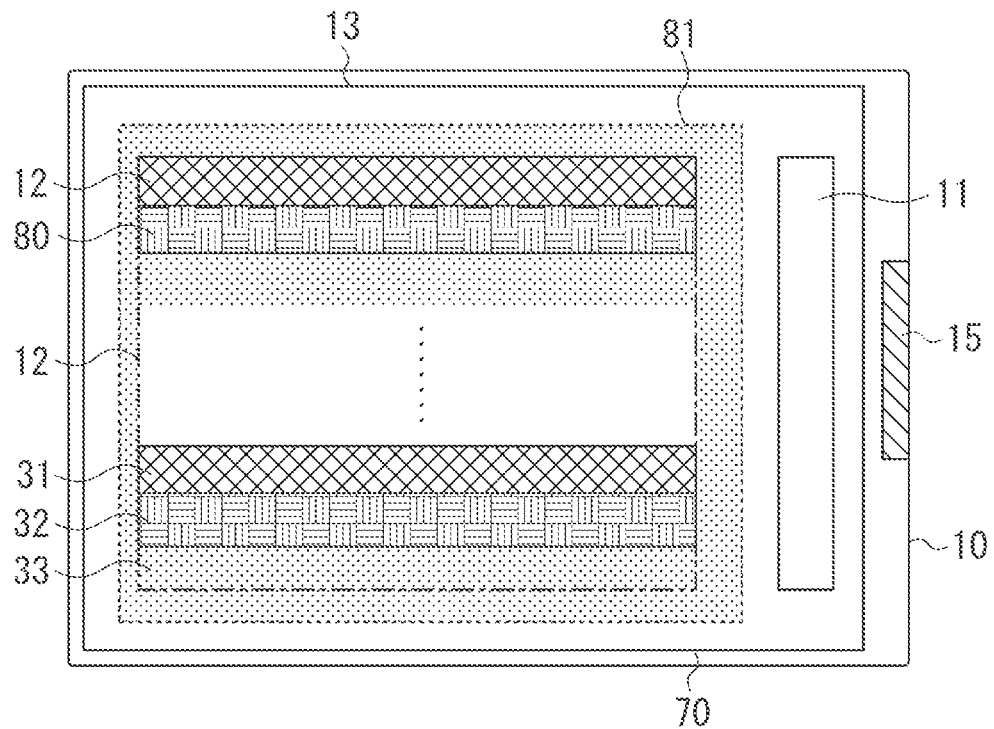
FIGS. 4A 4B, 4C, and 4D are schematic plan views illustrating layouts according to the present invention.

In FIG. 4A, the first and second organic compound layers 31 and 32 patterned first and second, respectively, are patterned in strips, each of which connects a plurality of first electrodes (not illustrated) arranged in a direction. Since all the end portions of the first and second organic compound layers 31 and 32 are patterned by dry etching using photolithography, the end portions have a large inclination angle. The third organic compound layer 33 patterned last is formed to be larger than the element area 12, and an end portion of the third organic compound layer 33 at the out most entire circumference has a smaller inclination angle than that of any other end portion located between organic EL elements. Thus, a current is allowed to flow to the contact portion 11 via the second electrode 70 in all directions. Above planar layout may be achieved by forming the third organic compound layer 33 through a vacuum deposition method using a deposition mask having an opening larger than the element area 12, and by executing patterning so that an end portion at the out most periphery of the film remains. In this way, the luminescent device may be manufactured without increasing the number of processes.

Figure 4B:
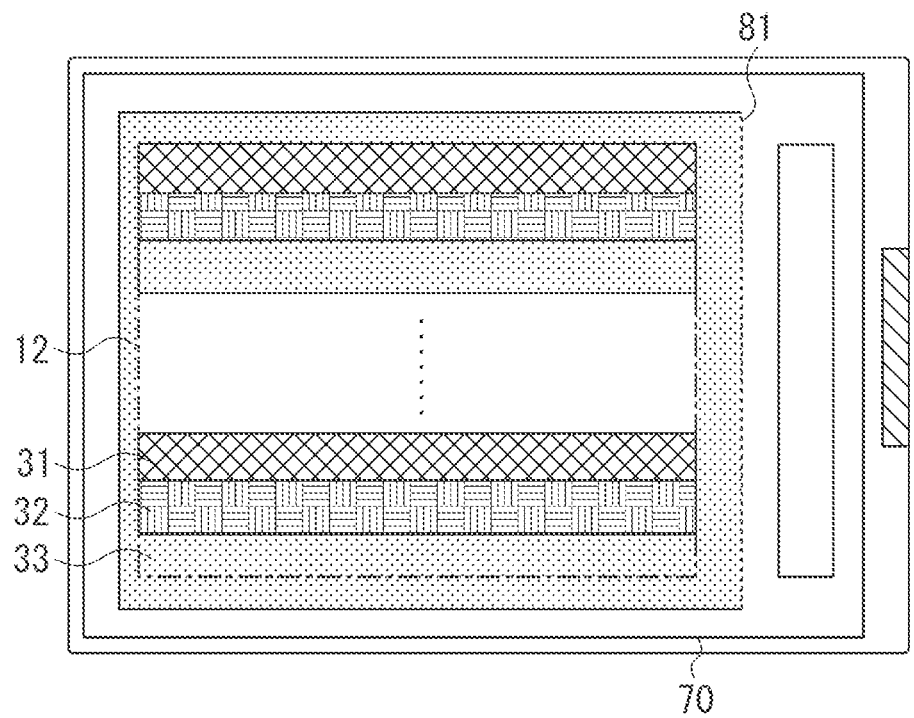

In FIG. 4B, as in FIG. 4A, the first and second organic compound layers 31 and 32 are patterned in strips, and all the end portions thereof have a large inclination angle. However, unlike the layout in FIG. 4A, among the four end portion of the third organic compound layer 33 that is not located between organic EL elements, an end portion along one side has a smaller inclination angle than that of any other end portion located between organic EL elements. Namely, a path of a current flowing through the second electrode 70 is secured in one direction. With this planar layout, among the end portion of the third organic compound layer 33 that is not located between organic EL elements, the end portions other than the end portion used as a current path may be formed to have a large inclination angle. Thus, the inclined area of the third organic compound layer 33, which occupies the periphery, may be reduced, and the distance between the element area 12 and the contact portion 11 may be reduced. Therefore, the area in which the organic EL elements are not arranged, that is, the area around the organic EL elements, which is referred to as frame area, may be reduced. An arbitrary side may be selected as the side having a small inclination angle. In FIG. 4B, only one side has a small inclination angle. However, since at least one side needs to have a small inclination angle, a plurality of sides may have a small inclination angle. As illustrated in FIG. 4B, if at least the side of the end portion near the contact portion 11 has a small inclination angle, the wiring resistance between the organic EL element and the contact portion 11 may be particularly reduced. Thus, the layout in FIG. 4B is particularly suitable. Above planar layout may also be achieved by forming the third organic compound layer 33 through a vacuum deposition method using a deposition mask having an opening larger than the element area 12, and by executing patterning so that an end portion at the side used as a current path remains as it is when the element is patterned.

Figure 4C:
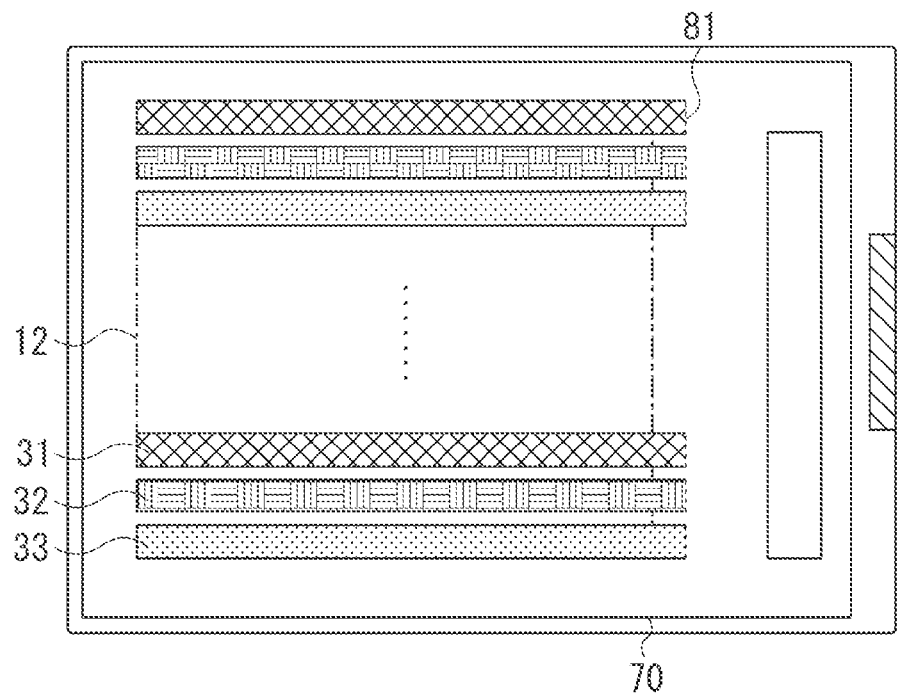

In FIG. 4C, an end portion of each of the organic compound layers 31 to 33 patterned in strips connecting a plurality of first electrodes 21 to 23 arranged in rows has a smaller inclination angle than that of any other end portion located between organic EL elements. Unlike the above layouts, each of an end portion between strip-shaped organic compound layers patterned by photolithography processes is not covered by an adjacent organic compound layer. Instead, the end portion is exposed.

This planar layout may be achieved by setting an end portion of an opening of a deposition mask between the element area 12 and the contact portion 11, forming each organic compound layer in the entire element area 12 by a vacuum deposition method, and executing patterning so that an end portion of the film formed by a deposition method remains as it is as an end portion that is not located between organic EL elements. For example, in the case of the second organic compound layer 32, the second organic compound layer 32 is not removed by using the intermediate layer 41 in the process in FIG. 2H. Instead, the second organic compound layer 32 on the first electrode 22 may be removed by using photolithography as in the first organic compound layer, while leaving the intermediate layer 41. However, the organic compound layer needs to be patterned while protecting a predetermined position of the film end portion formed by a deposition method from being etched. In addition, a path for a current flowing to the contact portion 11 via the second electrode 70 needs to be secured.

If the second electrode 70 is formed on the patterned first to third organic compound layers, since an end portion of an organic compound layer located between other organic compound layers has a large inclination angle, the second electrode 70 may be disconnected or the resistance of the second electrode 70 may be increased. However, with this layout in FIG. 4C, since each organic compound layer is continuously formed on the plurality of first electrodes arranged in one direction, the second electrode 70 does not have problems such as disconnection in the one direction. Thus, a current path to the contact portion 11 may be secured.

Figure 4D:
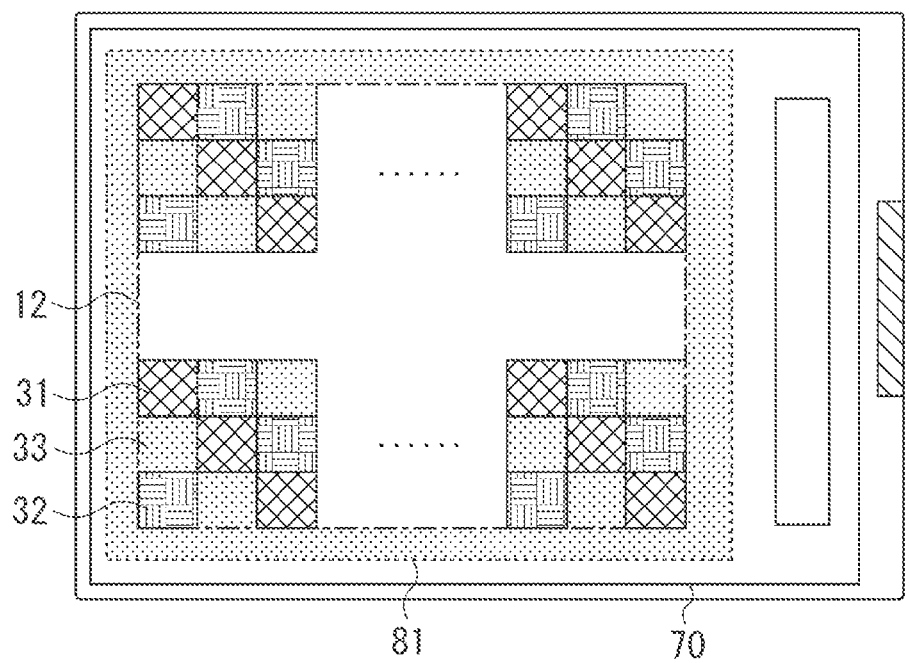

In FIG. 4D, each of organic compound layers is patterned according to the first electrode for respective organic EL elements. Each organic compound layer is formed so that an organic compound layer end portion that is patterned by the manufacturing method illustrated in FIGS. 2A to 2P and that is located between organic EL elements is in contact with an organic compound layer of an adjacent organic EL element at least in one direction. As in FIG. 4A, the third organic compound layers are formed on the entire element area 12 by setting an end portion of an opening of a deposition mask between the element area 12 and contact portion 11 and by executing a vacuum deposition method. Next, by executing patterning so that an end portion at the outmost periphery of the film formed by the deposition mask remains as it is, a path for a current flowing to the contact portion 11 via the second electrode 12 may be secured. As described above, embodiments may be modified to be applied to organic EL devices of various layouts.

Next, examples of manufacturing an organic luminescent device will be described in detail.

First, a first exemplary embodiment will be described. In the present exemplary embodiment, as in the manufacturing method illustrated in FIGS. 2A to 2P, the inclination angle of an end portion of the organic compound layer, which is not located between organic EL elements and located in an area where the second electrode 70 is formed, is formed by a vacuum deposition method using a deposition mask. In the present exemplary embodiment, the manufactured organic EL device has a configuration similar to that in FIGS. 1A and 1B and may display multiple colors of R, G, and B.

A glass plate is used as the substrate 10, and a circuit layer was formed on the glass plate in advance, the circuit layer including a circuit using a transistor (Tr), an interlayer insulating layer formed on the circuit, and a contact hole electrically connecting the circuit layer and a wiring layer. On the entire surface of the substrate 10, on which the circuit layer is formed, Al as a wiring layer is formed and patterned into a predetermined shape by a photolithography process. On top of the wiring layer, polyimide resin serving as an insulating layer (planarization film) is formed by using a spin coater and is patterned by a photolithography process. Subsequently, a contact hole is formed in the insulating layer. Simultaneously, the surfaces of the contact portion 11 and the external connection terminal 15 is exposed.

Next, as a first electrode layer, films of Al and indium tin oxide (ITO) are formed by using a sputtering method, and a plurality of first electrodes 21 to 23 divided per organic EL element are formed by a photolithography process. Al and ITO are formed to have film thicknesses of 100 nm and 30 nm, respectively.

Using known material insoluble in water, a first hole transport layer, a first luminescent layer that emits blue light, and a first electron transport layer were stacked in this order by a vacuum deposition method on the entire surface of the substrate 10 on which the first electrodes 21 to 23 are formed. In this way, the first organic compound layer 31 is formed.

Next, the first intermediate layer 41 for protecting the first organic compound layer 31 is formed. The first intermediate layer 41 is formed as a multilayer structure of a water-soluble polymer film and a silicon nitride film. First, polyvinylpyrrolidone solution is applied by a spin coating method. Next, after annealing, a water-soluble polymer film of 1 μm is formed, and a silicon nitride film of 1 μm is formed thereon by a CVD method.

Next, after positive photoresist material "AZ 1500" manufactured by AZ Electronic Materials plc. is applied onto the entire first intermediate layer 41 by a spin coating method, annealing is executed. As a result, the first photoresist layer 51 having a film thickness of 1000 nm is formed, as illustrated in FIG. 2C.

Next, to pattern the first resist layer 51, exposure device "MPA 600" manufactured by Canon Inc. is used. In addition, the first photomask 61 is used to shield the area over the first electrode 21. In this way, the substrate 10 is irradiated with the ultraviolet rays 60 to be exposed. The exposure time is 40 seconds.

After the exposure, the substrate 10 is soaked and developed in developer (a 50% solution of "312 MIF" manufactured by AZ Electronic Materials plc.) for one minute. Namely, the first resist layer 51 in the area irradiated with the ultraviolet rays 60 is soaked and dissolved in developer to pattern the first resist layer 51. As a result, as illustrated in FIG. 2E, the first resist layer 51 remains only in the area above the first electrode 21 corresponding to the shielding area of the first photomask 61.

The substrate 10 on which the first resist layer 51 remained is loaded in a dry etching apparatus to remove the first intermediate layer 41 and the first organic compound layer 31 in the area from which the first resist layer 51 has been removed. In the dry etching process, for the silicon nitride layer of the first intermediate layer 41, carbon tetrafluoride (CF4) is used as reactant gas. For the water-soluble polymer layer of the first intermediate layer 41 and the first organic compound layer 31, oxygen is used as reactant gas. In addition, the dry etching process is carried out under the following conditions:

flow rate 20 standard cubic centimeter per minute (sccm); pressure 8 pascal (Pa); output 150 watts (W); and time 5 minutes. In the above dry etching process, etching also proceeds in the area where the first resist layer 51 remains, and as a result, the first resist layer 51 and part of the first intermediate layer 41 are removed. Consequently, as illustrated in FIG. 2F, the surfaces of the first electrodes 22 and 23 are exposed.

As in the case of the first organic compound layer 31, the second organic compound layer 32 is formed by a vacuum deposition method on the entire surface of the substrate 10 on which the first electrodes 21 to 23 are formed. The second organic compound layer 32 is formed as a multilayer structure of a second hole transport layer (film thickness: 150 nm) formed of the same material as that of the first hole transport layer and a second luminescent layer (film thickness: 20 nm) formed of conventional green luminescent material insoluble in water.

The substrate 10, on which the second organic compound layer 32 is formed, is soaked in water for 10 minutes to dissolve the water-soluble polymer layer, and the second organic compound layer 32 together with the first intermediate layer 41 over the first electrode 21 are removed. As a result, the first organic compound layer 31 is formed on the first electrode 21, and the second organic compound layer 32 is formed on the first electrodes 22 and 23, as illustrated in FIG. 2H.

Next, as in the case of the first intermediate layer 41, the second intermediate layer 42 as a multilayer structure of a water-soluble polymer layer and a silicon nitride layer is formed on the entire substrate 10, as illustrated in FIG. 2I. Next, as in the case of the first resist layer 51, the second resist layer 52 is formed on the second intermediate layer 42 on the entire substrate 10, as illustrated in FIG. 2J. Next, as in the case of the first resist layer 51, the second photomask 62 is used to shield the area above the first electrodes 21 and 22 and to expose the substrate 10, as illustrated in FIG. 2K. Next, the substrate 10 is soaked and developed in developer for one minute. The second resist layer 52 in the area irradiated with the ultraviolet rays 60 is soaked and dissolved in developer. As a result, the second resist layer 52 remains only in the area above the first electrodes 21 and 22 corresponding to the shielding area of the second photomask 62, as illustrated in FIG. 2L.

By using the remaining second resist layer 52 as a mask, dry etching is carried out to remove the second intermediate layer 42 and the second organic compound layer 32 in the area where the second resist layer 52 is removed. The same etching conditions as those used to remove the first organic compound layer 31 are used. Thus, the first electrode 23 is exposed, as illustrated in FIG. 2M.

Next, as in the case of the first and second organic compound layers 31 and 32, the third organic compound layer 33 is formed in an area including the element area 12 by a vacuum deposition method. The third organic compound layer 33 is formed while the contact portion 11 is shielded by a deposition mask having an opening larger than the element area 12. The third organic compound layer 33 is formed as a multilayer structure of a third hole transport layer (film thickness: 20 nm) formed of the same material as that of the first hole transport layer and a third luminescent layer (film thickness: 30 nm) formed of conventional red luminescent material.

Next, the substrate 10, on which the third organic compound layer 33 is formed, is soaked in water for 10 minutes to dissolve the water-soluble polymer. In this way, the second intermediate layer 42 and the third organic compound layer 33 on the first electrodes 21 and 22 are removed. Thus, the first to third organic compound layers 31 to 33 are formed on the first electrodes 21 to 23, respectively, as illustrated in FIG. 2O.

Next, as illustrated in FIG. 2P, the second electrode 70 that is continuous across from the element area 12 to the contact portion 11 is formed on the patterned first to third organic compound layers 31 to 33. The second electrode 70 is formed of an silver-magnesium (Ag—Mg) alloy film having a thickness of 20 nm by a sputtering method. Finally, a silicon nitride film is formed by a CVD method on the area other than the external connection terminal 15 for shielding. Thus, the organic EL device according to the first exemplary embodiment is completed.

When the formed organic EL device is driven, neither disconnection nor a voltage increase of the second electrode 70 occurs. Suitable multicolor light emission is acquired. In addition, cross sections of these organic EL elements are observed by an electron microscope, to evaluate the inclination angles of end portions of the organic compound layers at a plurality of positions. The end portions of the first to third organic compound layers, each end portion being located between organic EL elements, has an inclination angle of approximately 85 degrees in average. End portions of the third organic compound layer that is not located between organic EL elements has an inclination angle of approximately 30 degrees in average. The second electrode 70 does not have a portion that is significantly thinned or disconnected.

Next, a second exemplary embodiment will be described. In the present exemplary embodiment, the inclination angle of an end portion of the organic compound layer, which is not located between organic EL elements and located in a area where the second electrode 70 is formed, is controlled by dry etching.

First, as in the first exemplary embodiment, the manufacturing method in FIG. 2 is executed until the exposed first electrode 23 is formed as illustrated in FIG. 2M.

Next, as illustrated in FIG. 3A, the third organic compound layer 33 is formed on the entire substrate 10, on which the first electrode 23 is exposed, by a vacuum deposition method without using a deposition mask. Next, as in the first exemplary embodiment, the substrate 10, on which the third organic compound layer 33 is formed, is soaked in water to dissolve the water-soluble polymer layer. The third organic compound layer 33 together with the second intermediate layer 42 on the first electrodes 21 and 22 are removed, as illustrated in FIG. 3B.

Next, as illustrated in FIG. 3C, the third intermediate layer 43 formed by two layers of a water-soluble polymer layer and a silicon nitride layer is formed on the first to third organic compound layers 31 to 33, and the third resist layer 53 is formed thereon. Next, by using the third photomask 63 which shields the element area 12 and has an opening in an area 13 including the contact portion 11, the third resist layer 53 is exposed, as illustrated in FIG. 3D, and the third resist layer 52 in the peripheral area that is not shielded by the third photomask 63 is removed by a developing process, as illustrated in FIG. 3E.

Next, the third intermediate layer 43 and the third organic compound layer 33 in the area where the third resist layer 53 has been removed are removed by dry etching, as illustrated in FIG. 3F. The conditions of the dry etching process are adjusted so that the third resist layer 53 has a gradual inclination angle. More specifically, the same conditions as those in the first exemplary embodiment are used, except that the pressure is 30 Pa in the dry etching process in which oxygen is used as reactant gas.

After dry etching, by soaking the substrate 10 in water and dissolving the water-soluble polymer layer of the third intermediate layer 43, the third intermediate layer 43 is removed. Next, an Ag—Mg alloy having a film thickness of 20 nm and continuous across from the element area 12 to the contact portion 11 is formed as the second electrode 70. Finally, a glass cap (not illustrated) is used for sealing, and an organic EL device capable of emitting full-color light is completed.

The completed organic EL device is driven by supplying a voltage and a signal via the external connection terminal 15. As a result, neither disconnection nor a voltage increase of the second electrode 70 occurs, and suitable light emission of three colors is acquired.

In addition, when cross sections of the organic EL device are observed, end portions of the first to third organic compound layers 31 to 33, each end portion being located between organic EL elements, has a maximum inclination angle of approximately 85 degrees. In addition, among the end portions of the third organic compound layers, each not being located between organic EL elements, the end portions that are patterned by a dry etching process has a maximum inclination angle of approximately 60 degrees.

Next, a third exemplary embodiment will be described. An organic EL device is manufactured as in the first exemplary embodiment, except that, as a common organic compound layer, a conventional electron injection layer having a film thickness of 20 nm is formed on the entire surface of the first to third organic compound layers 31 to 33 before an Ag—Mg alloy is formed as the second electrode 70. When the completed organic EL device is driven, neither disconnection nor a voltage increase of the second electrode 70 occurs, and suitable light emission of three colors is acquired.

In addition, when cross sections at a plurality of positions of this organic EL device are observed, the end portions of the first to third organic compound layers 31 to 33, each being located between organic EL elements, had a maximum inclination angle of approximately 85 degrees and are covered by adjacent organic compound layers. In addition, the electron injection layer is stacked on each of the end portions of the third organic compound layer, each not being located between organic EL elements. The surface layer has an inclination angle similar to that of the end portion of the third organic compound layer 33 and has a maximum inclination angle of approximately 30 degrees.

While the disclosure has been described with reference to exemplary embodiments, it is to be understood that the disclosure is not limited to the disclosed exemplary embodiments. The scope of the following claims is to be accorded the broadest interpretation so as to encompass all modifications, equivalent structures, and functions.

This application claims priority from Japanese Patent Application No. 2011-191413 filed Sep. 2, 2011, and Japanese Patent Application No. 2012-176006 filed Aug. 8, 2012, each of which is hereby incorporated by reference herein in its entirety.

What is claimed is:

1. An organic electroluminescent (EL) device, comprising:
a plurality of organic EL elements, each including a first electrode, an organic compound layer including at least a luminescent layer, and a second electrode which are stacked in this order in a predetermined area on a substrate; and
a wiring including an external connection terminal arranged outside the predetermined area on the substrate and a contact portion electrically connected to the external connection terminal,
wherein the first electrode is divided per the organic EL element,
wherein the organic compound layer is divided per one or a plurality of the organic EL elements, and
wherein the second electrode is commonly provided to the plurality of organic EL elements, and electrically connected to the wiring via the contact portion, and
wherein, among end portions of the organic compound layers, an end portion of an organic compound layer that is not located between organic EL elements and that is located in an area where the second electrode is provided has a smaller inclination angle with respect to the substrate than that of an end portion of an organic compound layer located between the organic EL elements.

2. The organic EL device according to claim 1, wherein the end portion of the organic compound layer having a smaller inclination angle with respect to the substrate than that of the end portion of the organic compound layer located between the organic EL elements is arranged between the predetermined area and the contact portion.

3. The organic EL device according to claim 1, further comprising a plurality of types of organic EL elements including luminescent layers different from each other,
wherein the organic EL elements are arranged in row direction and in column direction, and
wherein the divided organic compound layers adjacent each other in column direction or in row direction include luminescent layers different from each other.

4. The organic EL device according to claim 1, wherein an area where the end portion of the organic compound layer located between the organic EL elements is inclined with respect to the substrate has a width smaller than a film thickness of the organic compound layer.

5. The organic EL device according to claim 1,
wherein the end portion of the organic compound layer located between the organic EL elements is covered with an adjacent organic compound layer.

6. The organic EL device according to claim 1, wherein the end portion of the organic compound layer located between the organic EL elements is formed by photolithography.

7. The organic EL device according to claim 1, wherein the end portion of the organic compound layer that is not located between the organic EL elements is formed by a vacuum deposition method using a mask.

8. A manufacturing method of the organic EL device according to claim 1, the method comprising:
performing a first operation for preparing a substrate on which an external connection terminal, a wiring, and a plurality of first electrodes are formed;
performing a second operation for selectively forming a first organic compound layer on a portion of the plurality of first electrodes;
performing a third operation for forming a second organic compound layer including a luminescent layer different from that of the first organic compound layer on a first electrode, among the plurality of first electrodes, on which an organic compound layer is not formed; and
performing a fourth operation for forming a second electrode in an area including the first organic compound layer and second organic compound layer, and the contact portion,
wherein the second operation includes patterning the first organic compound layer by photolithography, and wherein the third operation includes forming the second organic compound layer by using a mask having an opening corresponding to the area where the plurality of first electrodes is arranged.

9. The organic EL device manufacturing method according to claim 8, wherein the second operation includes forming a first organic compound layer and an intermediate layer in this order on the substrate on which the plurality of first electrodes is formed, forming a resist layer on a portion of the plurality of first electrodes by photolithography and removing, by dry etching, the first organic compound layer and the intermediate layer above the first electrodes on which the resist layer is not formed, and wherein the third operation includes forming a second organic compound layer on the first electrodes, from which the first organic compound layer and the intermediate layer are removed, by using a mask having an opening corresponding to the area where the plurality of first electrodes is arranged, and dissolving the intermediate layer to remove the second organic compound layer formed on the intermediate layer.

10. The organic EL device manufacturing method according to claim 8, wherein the intermediate layer is formed of water-soluble material.

11. The organic EL device manufacturing method according to claim 10, wherein the second operation further comprises forming a layer including water-insoluble material between the intermediate layer and the resist layer.

12. The organic EL device manufacturing method according to claim 8, further comprising a fifth operation, between the second and third operation, for selectively forming a third organic compound layer including a luminescent layer different from those of the first and second organic compound layers on a portion of the plurality of first electrodes on which the first organic compound layer is not selectively formed in the second operation.

13. The organic EL device manufacturing method according to claim 12, wherein the fifth operation includes patterning the third organic compound layer by photolithography.

* * * * *